(12) United States Patent
Proctor et al.

(10) Patent No.: US 9,599,775 B2
(45) Date of Patent: Mar. 21, 2017

(54) SET TOP BOX HAVING LIGHT PIPE BRACKET

(75) Inventors: Christopher Michael William Proctor, Westfield, IN (US); Donald Edward Sutter, Martinsville, IN (US); Joseph Lee Carpenter, Noblesville, IN (US)

(73) Assignee: THOMSON LICENSING, Issy les Moulineaux (FR)

( * ) Notice: Subject to any disclaimer, the term of this patent is extended or adjusted under 35 U.S.C. 154(b) by 200 days.

(21) Appl. No.: 14/125,960

(22) PCT Filed: Jun. 14, 2012
(Under 37 CFR 1.47)

(86) PCT No.: PCT/US2012/042494
§ 371 (c)(1),
(2), (4) Date: Jun. 30, 2014

(87) PCT Pub. No.: WO2012/174266
PCT Pub. Date: Dec. 20, 2012

(65) Prior Publication Data
US 2014/0340928 A1    Nov. 20, 2014

Related U.S. Application Data

(60) Provisional application No. 61/496,623, filed on Jun. 14, 2011.

(51) Int. Cl.
| | | |
|---|---|---|
| *A41F 1/00* | (2006.01) | |
| *G02B 6/36* | (2006.01) | |
| *F21V 8/00* | (2006.01) | |
| *H05K 5/00* | (2006.01) | |
| *G02B 6/32* | (2006.01) | |
| *H05K 1/02* | (2006.01) | |

(52) U.S. Cl.
CPC ......... *G02B 6/3616* (2013.01); *G02B 6/0008* (2013.01); *G02B 6/0096* (2013.01); *G02B 6/32* (2013.01); *H05K 1/0274* (2013.01); *H05K 5/0017* (2013.01)

(58) Field of Classification Search
CPC .............................. G02B 6/42; G02B 6/0093
See application file for complete search history.

(56) References Cited

U.S. PATENT DOCUMENTS 5,481,440 A    1/1996 Oldham et al.
5,988,842 A    11/1999 Johnsen et al.
(Continued)

FOREIGN PATENT DOCUMENTS

| DE | 10308019 | 10/2004 |
|---|---|---|
| EP | 1630577 | 3/2006 |
| JP | H10289295 | 10/1998 |

OTHER PUBLICATIONS

Search Rept:Sep. 20, 2012.

*Primary Examiner* — Andrew Coughlin
(74) *Attorney, Agent, or Firm* — Brian J. Dorini; Jerome G. Schaefer (57) ABSTRACT

A light pipe bracket (6) for an electronic device is provided that comprises a planar main body, light pipes (13) each having a proximal end and a distal end in which the light pipe extends from the distal end at the planar main body toward the distal end, and circuit board holding means (7) that support at least a portion of a circuit in the electronic device.

14 Claims, 9 Drawing Sheets

(56) References Cited

U.S. PATENT DOCUMENTS

| | | | |
|---|---|---|---|
| 6,045,249 A * | 4/2000 | Bellinghausen | G02B 6/4298 340/815.45 |
| 6,678,021 B2 | 1/2004 | Ohkawa | |
| 6,692,132 B1 | 2/2004 | Meeker | |
| 6,924,437 B1 | 8/2005 | Creekmore et al. | |
| 2006/0044819 A1* | 3/2006 | Bul | B60Q 3/004 362/551 |
| 2009/0009758 A1 | 1/2009 | Gilby | |
| 2009/0283321 A1 | 11/2009 | Huang et al. | |
| 2010/0025214 A1 | 2/2010 | Roose et al. | |

* cited by examiner

SET TOP BOX HAVING LIGHT PIPE BRACKET

CROSS-REFERENCE TO RELATED APPLICATIONS

This application claims the benefit, under 35 U.S.C. §365 of International Application PCT/US2012/042494, filed Jun. 14, 2012, which was published in accordance with PCT Article 21(2) on Dec. 20, 2012 in English and which claims the benefit of U.S. provisional patent application No. 61/496,623, filed Jun. 14, 2011.

FIELD OF THE INVENTION

The invention relates to an electronic device such as a set top box having light pipes.

BACKGROUND

Consumer demand for electronic devices which are more powerful and sophisticated and are yet quiet, compact, and robust has not been satisfied. However, the reality is that modern electronic products packaging continues to evolve towards lower cost parts, lower cost assembly techniques, and simpler assemblies. Meeting the consumer demand remains a difficult challenge in light of the electronic industry evolution.

Products, such as set top boxes, digital versatile disk players, game consoles, and computing devices have evolved to a point where often these products utilize a structure that packages all electronic components on a single printed circuit board. Included in this packaging may be one or more indicator lights, usually utilizing light emitting diodes (LEDs).

While light sources are easily placed on the circuit board, they are small and do not have any light focusing capabilities in and of themselves. Therefore, to better project the light to the outside through a front panel, structures known as light pipes are employed. However, these light pipes are often individually connected to each light source assembly or may be grouped in sets that connect to each light source assembly. In both cases, separate mechanical components are created and used for these light pipes which increases the number of parts and increases the cost for the product. This trend can be in contrast to an integrated solution. For example, a separate mechanical frame structure is often needed for the location and retention of the printed circuit board assembly itself in the mechanical package. Additionally, the light pipes are each separate mechanical structures.

Because light sources and associated parts in many types of electronic devices increase costs and the number of parts, a need exists for a light pipe system that is integrated into a larger mechanical assembly as a single component.

SUMMARY OF THE INVENTION

The present embodiments are directed to a mechanical assembly having the beneficial structural aspects of retaining, supporting, and integrating one or more light pipes into the mechanical assembly. More specifically, the one piece mechanical assembly is a light pipe bracket, which allows the light pipes to guide light and isolate the light where needed, and which further holds at least one printed circuit board mechanically in place.

The light pipe bracket can be for an electronic device and can comprise a planar main body; and a light pipe or pipes each having a proximal end and a distal end, wherein the light pipe or pipes extending from the proximal end at the planar main body toward the distal end. The proximal end of a light pipe can be positioned in an aperture of the planar main body and a plurality of support bars can extend from an edge of the aperture to a periphery of the proximal end, thereby supporting the light pipe. The distal end is a light entrance end and the proximal end is a light exit end. The light pipe bracket can comprise a plurality holding means such as ribs or slots in the planar main body for supporting a printed circuit board in the electronic device.

Other embodiments of the invention are directed toward an electronic device such as a set top box that comprises a base frame; a first printed circuit board over the base frame in which the first printed circuit board has a front edge; two opposing frame side walls extending perpendicularly from the base frame in which each of the frame side walls can optionally have a clip receiving aperture; a rear frame wall extending perpendicularly from the base frame; a light source positioned between the two opposing frame side walls; and a light pipe bracket. The light pipe bracket can comprises a planar main body; a light pipe having a proximal end and a distal end in which the light pipe extends from the distal end at the planar main body toward the distal end and the light source is positioned at the distal end; and holding means on the planar main body in which the holding means engage the front edge of the first printed circuit board, thereby supporting at least a portion of the first printed circuit board. The light pipe bracket can optionally comprise a retention clip extending from the planar main body in which the retention clip engages the clip receiving apertures of the frame side walls, thereby supporting the light pipe bracket. The proximal end of the light pipe can be positioned in an aperture of the planar main body and a plurality of support bars can extend from an edge of the aperture to a periphery of the proximal end, thereby supporting the light pipe. The device can include a plurality of the light pipes, wherein each of the light pipes can be positioned in an aperture of the planar main body and be supported by a plurality of the support bars. Also, a lens can be positioned at each of the distal ends. The light pipe bracket can further comprise base engaging protrusions that extend downward from the planar main body, wherein the base engaging protrusions are positioned into slots of the frame base to secure at least part of the bracket in the device. The device can have a second printed circuit board between the first printed circuit board and the frame base. The second printed circuit board can be supported by posts on the frame base. The light sources can be on light source assemblies and these can be on the first or second printed circuit board. One of the printed circuit boards can further comprise an upper circuit board structure and a lower circuit board structure that are parallel to one another and connected through a central connecting portion in central regions of the upper and lower circuit board structures. The front edge of the first printed circuit board that the holding means holds can be a front edge of the upper board structure and additional holding means on the planar main body can support a front edge of the lower board structure. Also, one of the printed circuit boards can be a main circuit board and another printed circuit board can be a daughter printed circuit board. Additional features include at least a portion of the second printed circuit board being supported by posts on the base frame. Other features include the planar main body and a front lens at the proximal end of the light pipe being black tinted.

BRIEF DESCRIPTION OF THE DRAWINGS

The invention will be explained in detail with reference to the drawings in which.

DETAILED DESCRIPTION

Figure 1:
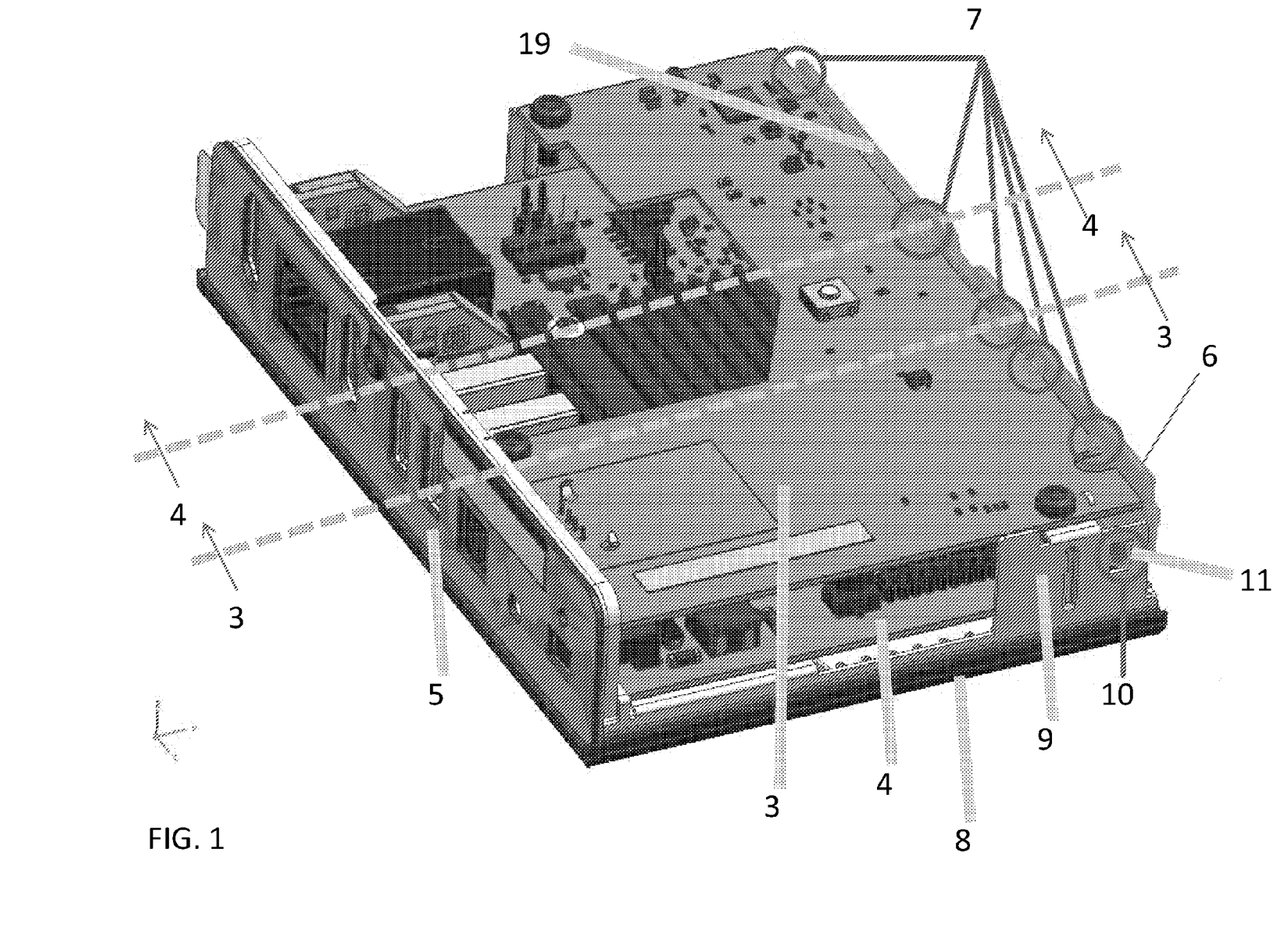
FIG. 1 illustrates a perspective view of an electronic device according to the invention.

FIG. 1 illustrates a perspective view of an electronic device 1 which can be set top box, video player, gaming device or the like. The top of the device is omitted to show the interior components. The device 1 shown here can have at least one print circuit board. However, in this embodiment a first printed circuit board 3 is shown being over a second printed circuit board 4, wherein the circuit boards extend from a vertical rear frame wall 5 to the light pipe bracket 6. The device 1 is shown having a generally horizontally frame base 8 having a rear edge from which the vertical rear frame wall 5 extends, wherein the rear frame wall 5 can be an external part and support and/or house the panel jack and various connectors to the electronic device 1. The device 1 is also shown having a vertical side wall 9 which can extend from a side edge of the frame base 8, wherein the vertical side wall 9 can be perpendicular to the rear frame wall 5 and a vertical plane body of the light pipe bracket 6. This vertical side wall 9 can be positioned near or adjacent to a front edge of the frame base 8. The vertical side wall 9 can have a clip or hook receiving aperture 10 located closer to the front edge than the rear edge of the frame base 8, wherein the aperture is intended to refer to a clearance hole, an indent or the like. The clip or hook receiving aperture 10 can be engaged by a clip or hook 11 or the like of the light pipe bracket 6 to assist in supporting the light pipe bracket 6. A similar vertical side wall 9 with clip or hook receiving aperture 10 and a clip or hook 11 can be at the opposite side edge of the frame base 8. The clips or hooks can assist in supporting and positioning the bracket 6. In this example, the clips or hooks 11 extend at a right angle rearward from the vertical side edges of the planar main body structure 19 of the bracket 6 and the clips or hooks 11 are positioned on the inner sides of the respective vertical side walls 9, wherein the clips or hooks provide an outward lateral spring force toward the respective vertical side walls 9 such that outwardly directed tabs at the ends of the springs or hooks engage or enter the receiving apertures 10. The clips can be referred to as retention clips. As shown in FIG. 1, the printed circuit boards can generally be planar and horizontally oriented to be perpendicular to the vertical rear frame wall 5. The light pipe bracket 6 is shown having a plurality of ribs 7 which are designed to support the at least one printed circuit board. The ribs 7 can be in pairs which can form a squared inner profile or form a concave surface or C-shape in which the inner profile or concave side engages a front edge of the first printed circuit board 3.

Figure 2:
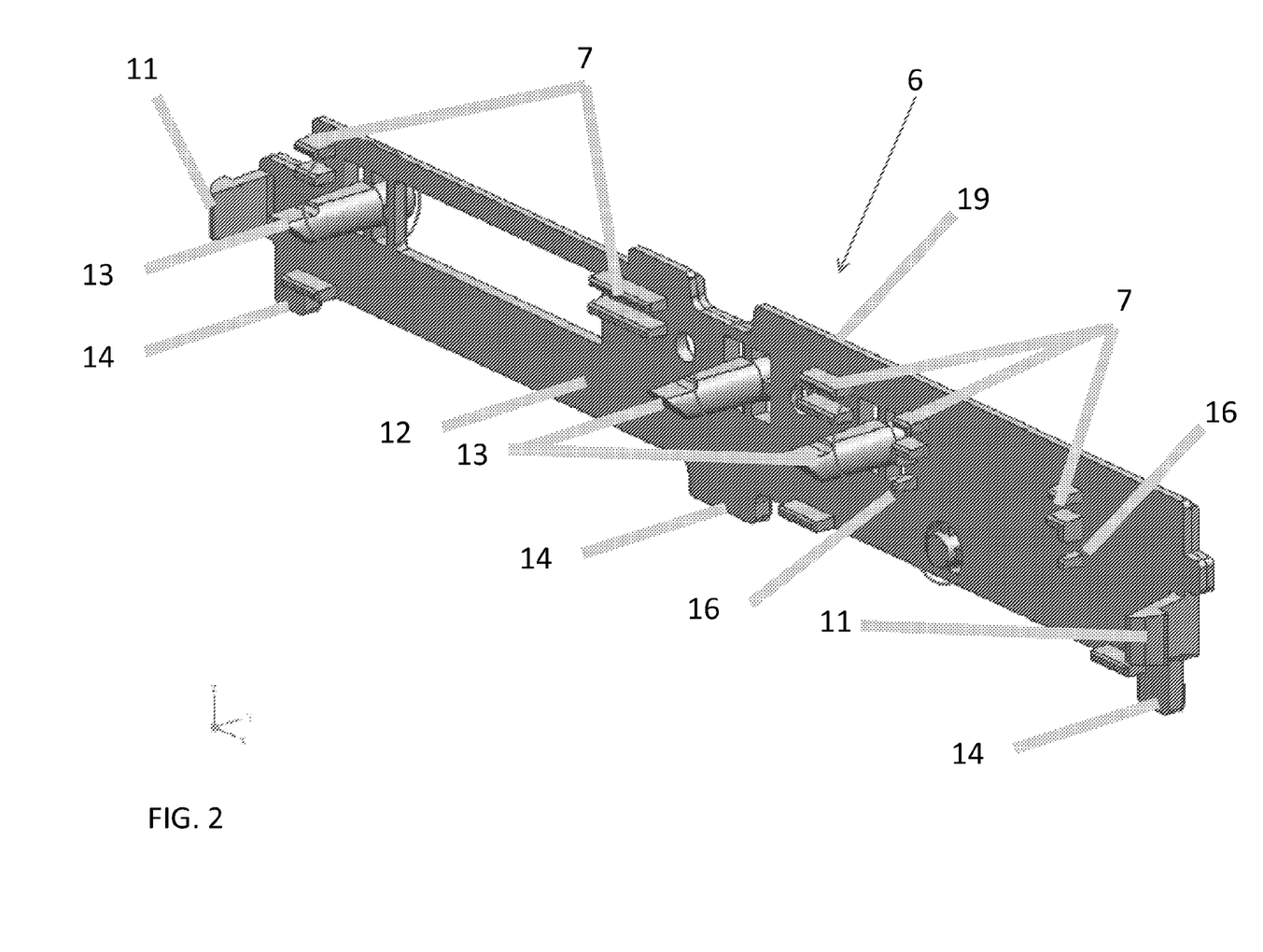
FIG. 2 illustrates a perspective view of the light pipe bracket according to the invention.

FIG. 2 illustrates a perspective view of the key mechanical frame structure or light pipe bracket 6 according to the invention. The bracket can have a generally planar interior surface 12. The shape and orientation of the bracket 6 is such that the interior surface is generally flat and perpendicular to the planes of the printed circuit boards. FIG. 2 shows how a plurality of the ribs 7 and a plurality of light pipes 13 can protrude inwardly from the surface 12. The front edge of a printed circuit board can slide into the concavity of the ribs 7 to hold and even suspend the circuit board in the device, which can imply that it supports at least part or a front half of the circuit board. The ribs 7 can be designed such they tightly grips the front edge of printed circuit board. The bracket 6 is shown having three separate light pipes 13 integrated into the structure, wherein the light pipes 13 can be generally hollow cylindrical or funnel shaped structures having light exit ends at or near the interior surface of the bracket 6 and a light entrance ends at, near or adjacent to the distal end of the light pipes 13. The bracket 6 further can include base engaging protrusions 14 that extend downward from a generally horizontal bottom edge of the bracket 6. The bracket 6 can further include additional ribs 16 to support other structures within the device 1. Based on the positioning of the ribs 7 and additional ribs 16, it is understood that the light pipes 13 in some embodiments are at a lower lateral level than the ribs 7 and the first circuit board 3 and at a higher lateral level than the additional ribs 16 and the second circuit board 4.

Figure 3:
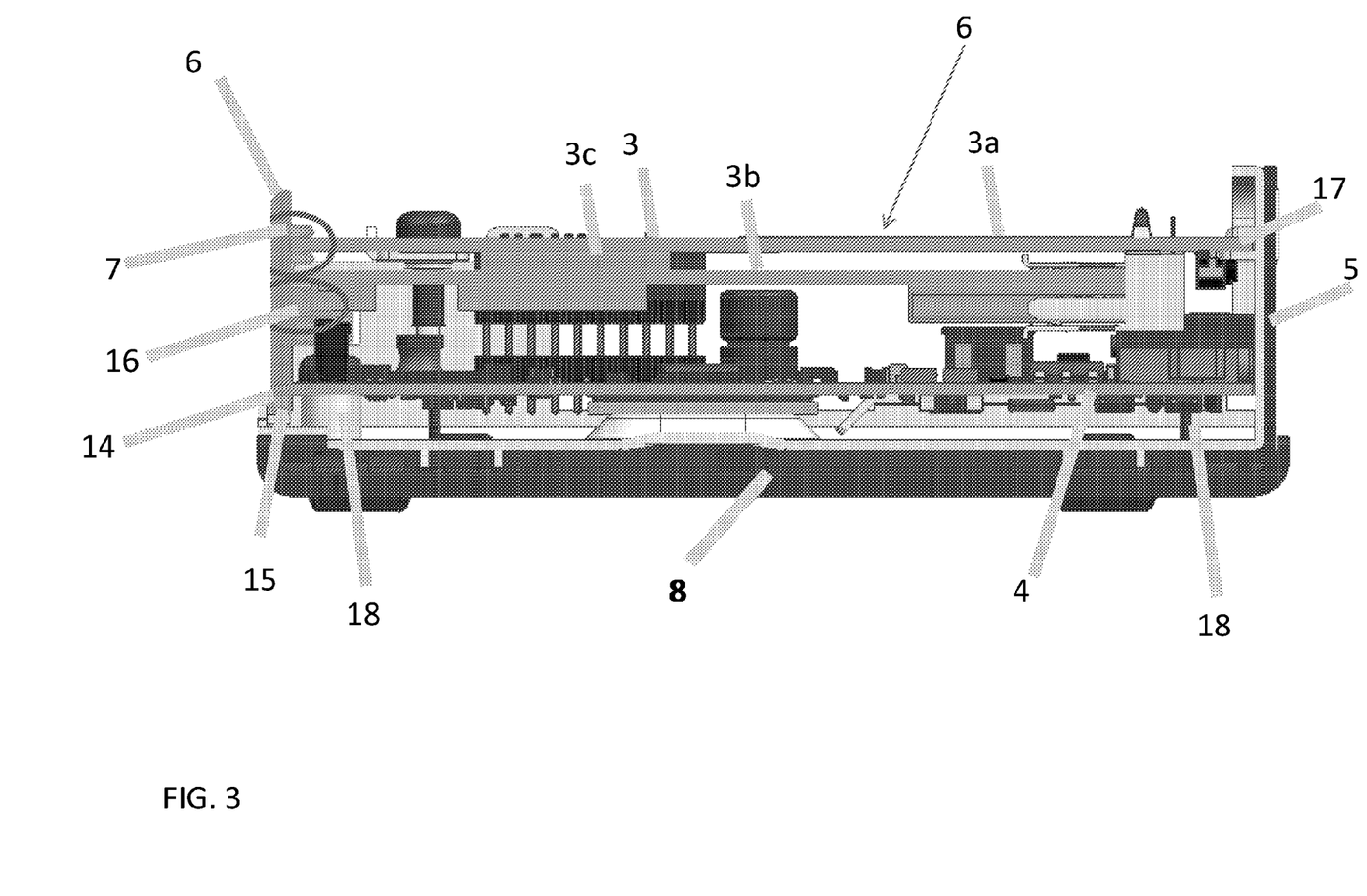
FIG. 3 illustrates a sectional view of the electronic device cut along slice 3-3 in FIG. 1.

FIG. 3 illustrates a sectional view of an electronic device 1 in FIG. 1 along slice 3-3. This view shows how the first printed circuit board 3 is supported at one end by the ribs 7, which can also be characterized as clips. In this view, the pairs of ribs 7 have the squared inner profile and engage a front edge of the first printed circuit board 3. The first printed circuit board 3 can be further supported by some other structural feature within the device to completely support the board 3, wherein the other structural feature can be a rear wall slot 17 or holding means in the rear frame wall 5. The other structural feature that can assist in supporting the board 3 can be at least one post that can extend from the frame base 8. FIG. 3 further shows how the lower portion of the bracket 6 can be supported and or positioned by at least one slot 15 in the frame base 8 at the front of the device 1 that receives an engaging protrusion 14 or bottom edge of the bracket 6.

In one embodiment, the printed circuit board 3 can be a two component printed circuit board having an upper circuit board structure 3a and a lower circuit board structure 3b which can generally be parallel to one another and connect by a central connecting portion 3c in central regions of the upper and lower structures 3a, 3b. The upper circuit board structure 3a can have the front edge that engages the ribs 7. The second component can be the lower circuit board structure 3b which can have a front edge as well that can rest on the additional ribs 16, whereby the additional ribs support the front half of the lower circuit board structure 3b as shown in FIG. 3.

FIG. 3 also shows a possible embodiment which includes the second circuit board 4 in which the front edge of the second circuit board 4 can contact the light pipe bracket 6. In an embodiment, the second circuit board 4 can be a main circuit board of a set top box or the like and the first printed circuit board 3 can be a daughter printed circuit board, wherein the first printed circuit board 3 can further be a WiFi device or component. The second board 4 can be supported by posts 18 on the base frame 8.

Figure 4:
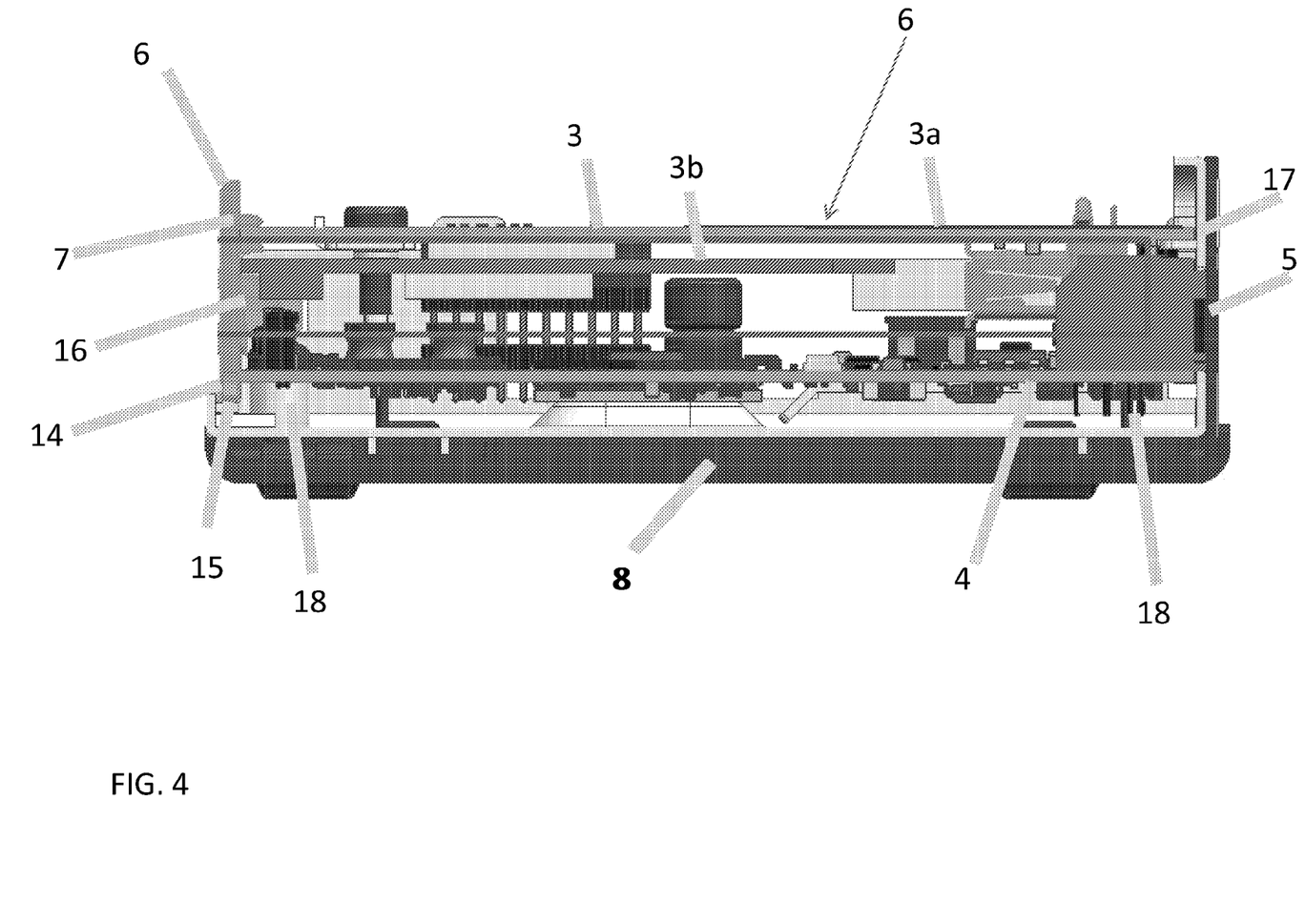
FIG. 4 illustrates another sectional view of the electronic device cut along slice 4-4 in FIG. 1.

FIG. 4 illustrates another sectional view of the electronic device cut along slice 4-4 in FIG. 1. Although this view is similar to the view in FIG. 3, it shows that there can be certain locations in which substantial portions of the upper circuit board structure 3a and the lower circuit board structure 3b do not have a central connecting portion 3c therebetween. In such locations, it is important that the additional rib 16 support the front end of the lower circuit board structure 3b.

Figure 5:
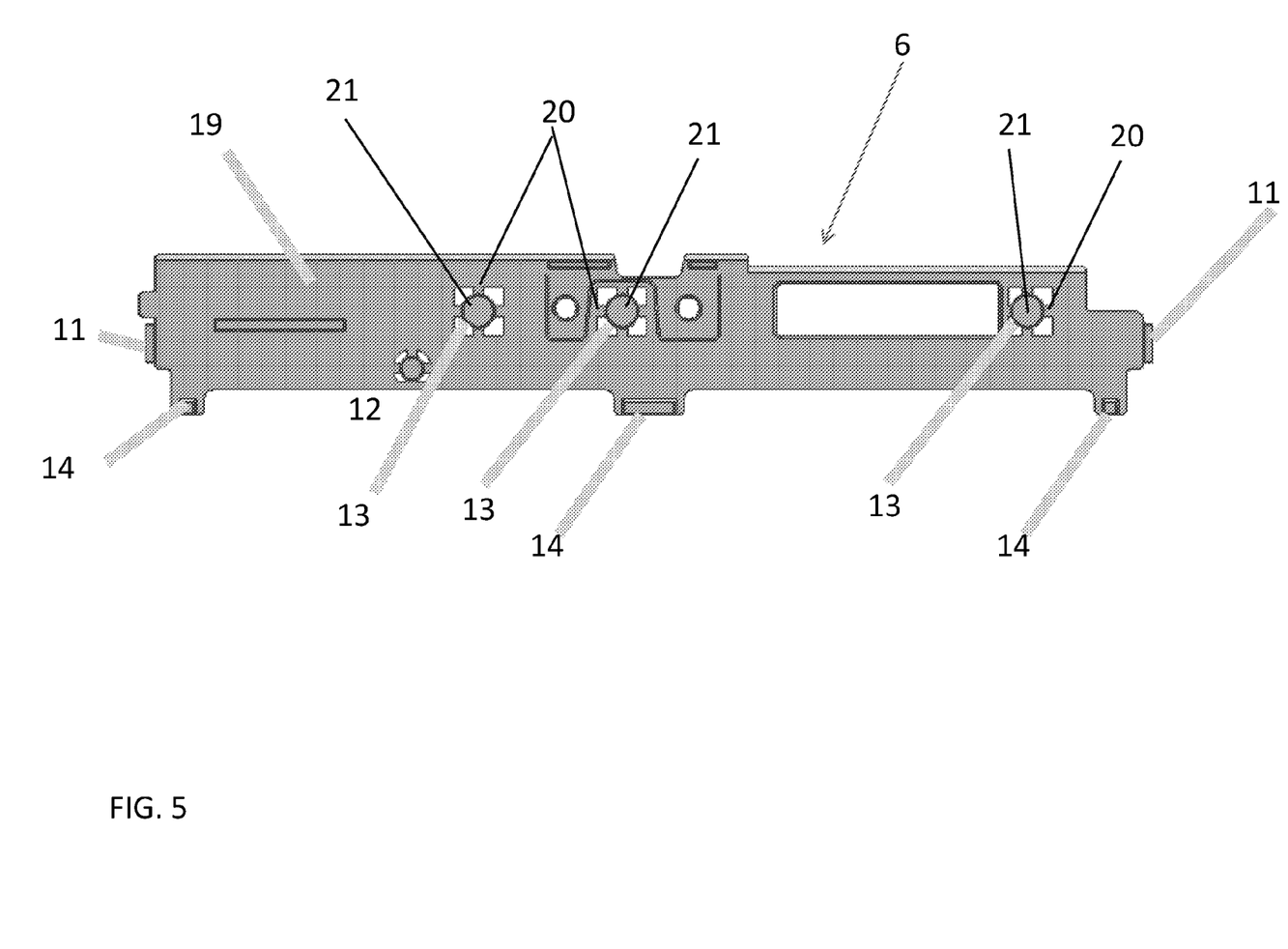
FIG. 5 is a front plan view of the light pipe bracket according to an embodiment of the invention.

FIG. 5 shows a plan front view of the light pipe bracket 6. This view illustrates an embodiment of the invention showing how the light pipes 13 are supported by the planar main body structure 19 of the bracket 6. This view shows how the light pipes 13 can be isolated from other structural features by being suspended by narrow support bars 20 connected between the periphery of the light pipes 13 and the planar main body structure 19. There can be four support bars 20 surrounding the light pipes 13 at the light exit end of the light pipes. The light pipes can further include optical components 21 at the light exit end of the pipes 13. Each of these support bars 20 assists in limiting diffusion of light from the light pipe into the main body structure 19. Further, these support bars 20 can be used in unison with a thinned out wall covering for the front panel of the device (not shown) and have black tinting to minimize light leakage. The optical components 21 can be or can include a front lens which can be a plano-convex lens. The optical components 21 can be coated with the black tinting or can themselves be tinted to the extent needed to control the amount of light exiting the optical components 21 for display to a viewer and/or inhibit light leakage to unwanted areas.

Figure 6:
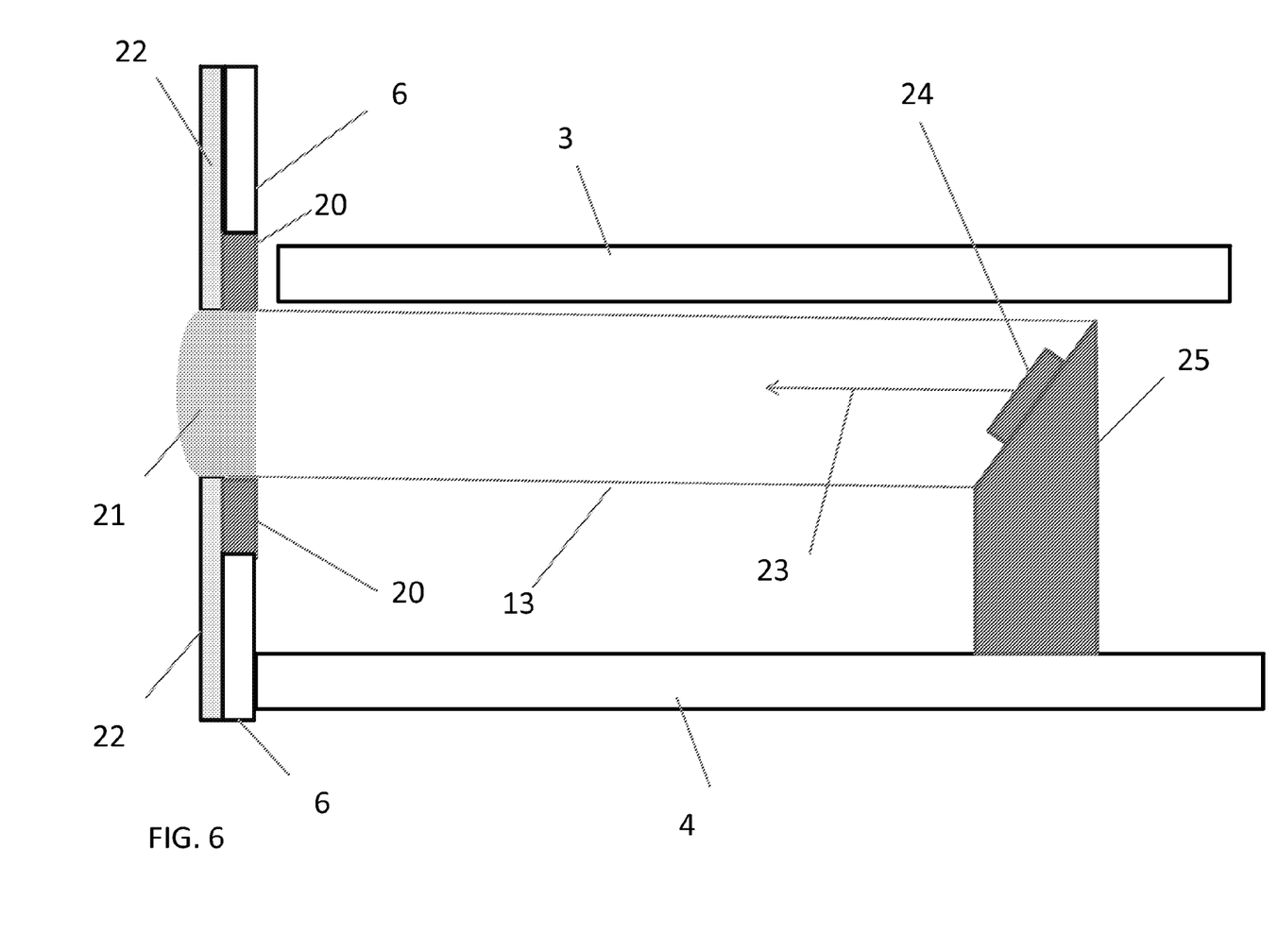
FIG. 6 is sectional view of the light pipe bracket, light pipe and light assembly according to the invention.

FIG. 6 illustrates a cross sectional view of the use of a light pipe 13 in the device 1 and how the light pipe 13 can be positioned with respect to the light source 24. This view shows that the light pipe 13 has its light entrance end positioned next to or abutting a light source assembly 25 which controls the light source 24 thereon. The light entrance end can be angled at 45 degrees, for example, with respect to the plane of the frame base 8 and/or the longitudinal axis of the respective light pipe. The light source 24 when activated emits light 23 that can propagate along the hollow cylindrical or funnel interior of the light pipe 13 toward the light exit end of the light pipe 13 that can hold the optical component 21. The optical component 21 is shown protruding through or resting in an opening in the front panel 22 of the device 1. This front panel 22 can be part of the exterior of the device and can be adjacent to the bracket 6. This view of the device further illustrates how the support bars 20 carry or hold the light pipe 13. The interior surface of the light pipe 13 between the exit and entrance ends can be mirrored or coated to appropriately permit the correct amount of light to propagate along the light pipe toward the light exit end near the front panel 22. FIG. 6 shows that the light source assembly 25 is supported on the second printed circuit board 4 and the first printed circuit board 3 is over the light pipe 13. However, the light source assemblies 25 shown in FIG. 6 and the other light source assemblies associated with the other light pipes 13 can be supported on the first circuit board 3 or the second circuit board 4.

Figure 7:
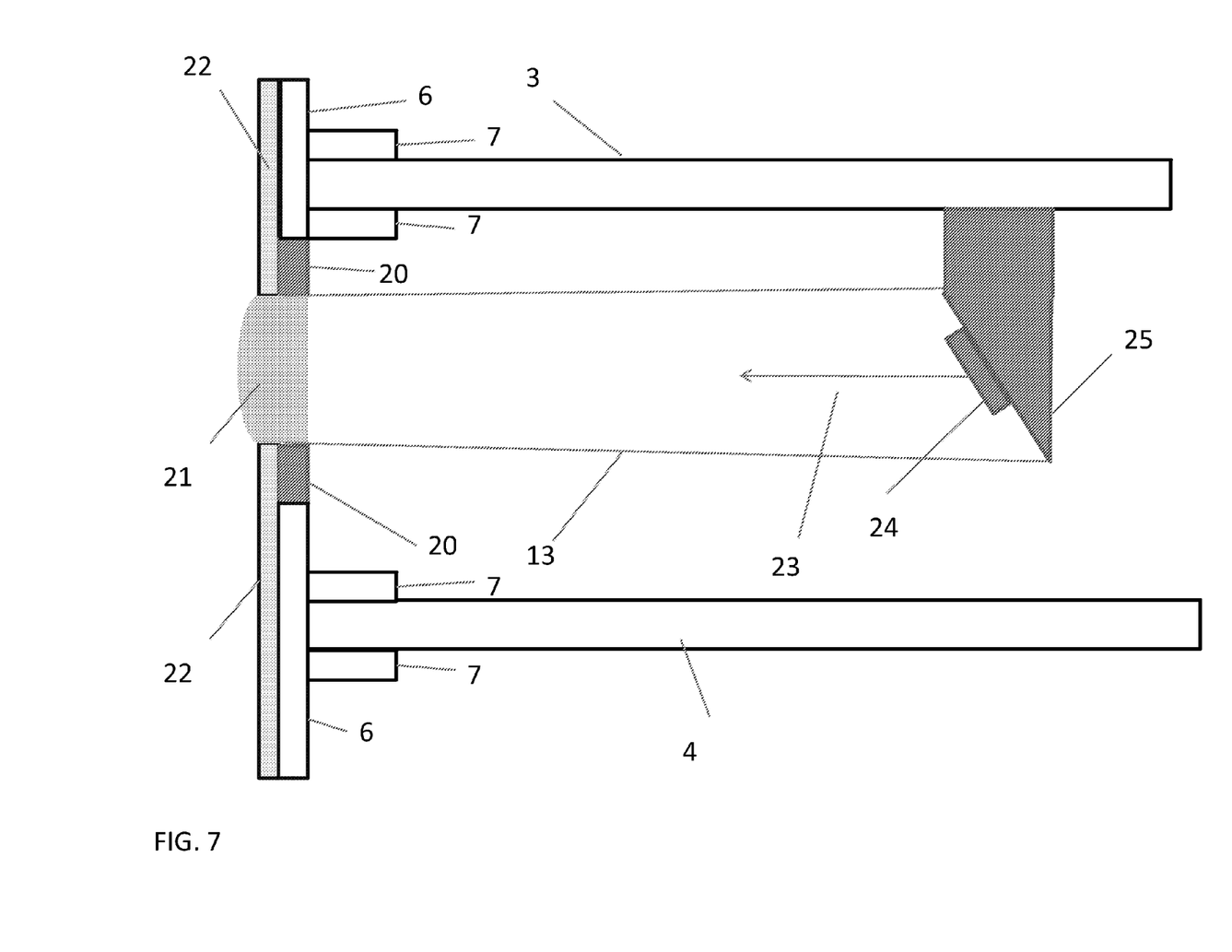
FIG. 7 is sectional view of the light pipe bracket, light pipe and light assembly according to another embodiment of the invention.

FIG. 7 shows an embodiment in which the light source assemblies 25 can be supported by the second circuit board 4 and also shows that the second circuit board 4 can have a front edge supported by ribs 7.

Figure 8:
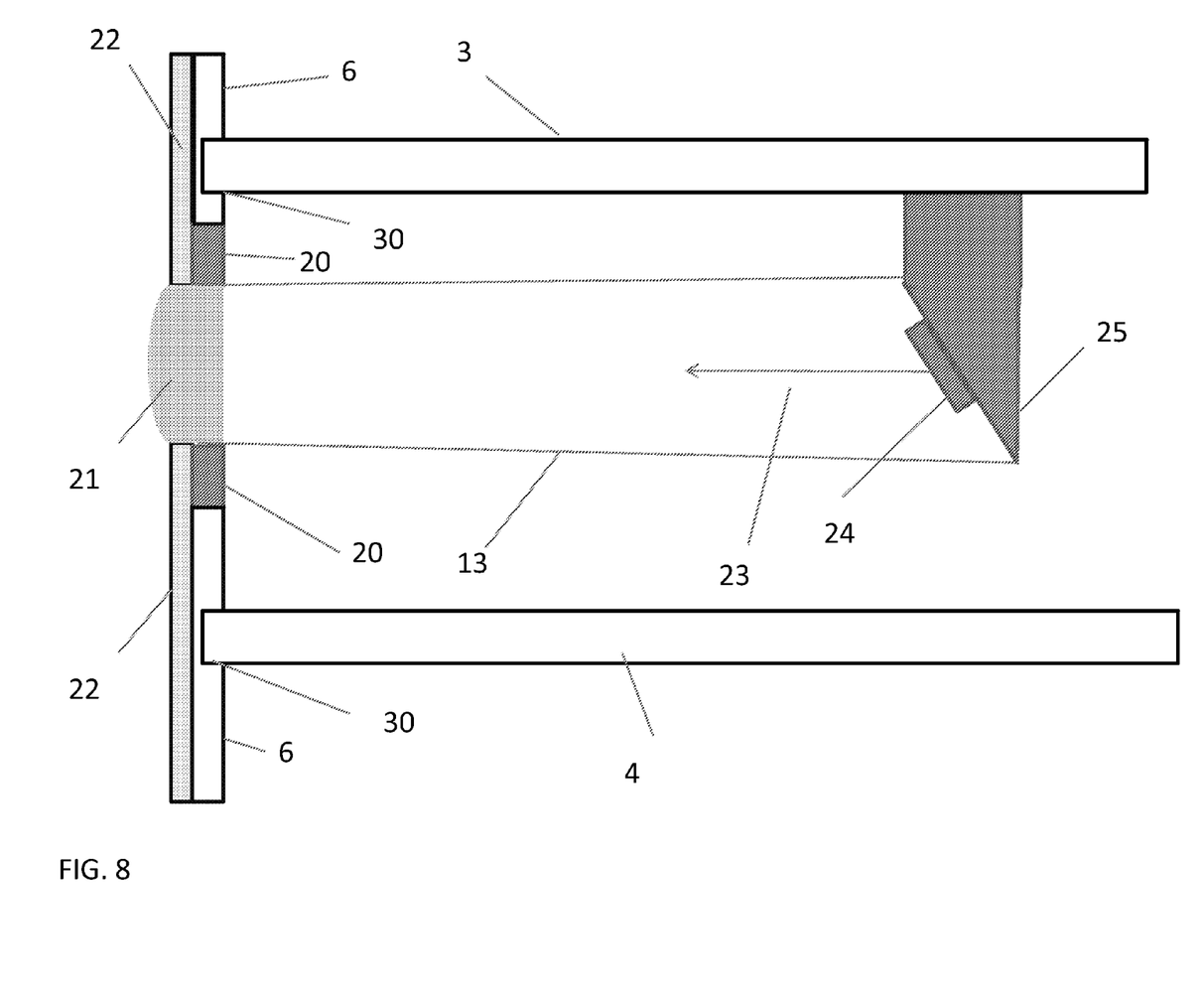
FIG. 8 is sectional view of the light pipe bracket, light pipe and light assembly according to an additional embodiment of the invention.

Although the preferred holding means for the edge of the circuit board are ribs 7, because they work in concert with circuit boards having straight edges, other holding means are considered within the spirit of the invention such as slots 30 in the bracket 6 which can receive and hold the front or leading edge of the circuit board as shown in FIG. 8.

Figure 9:
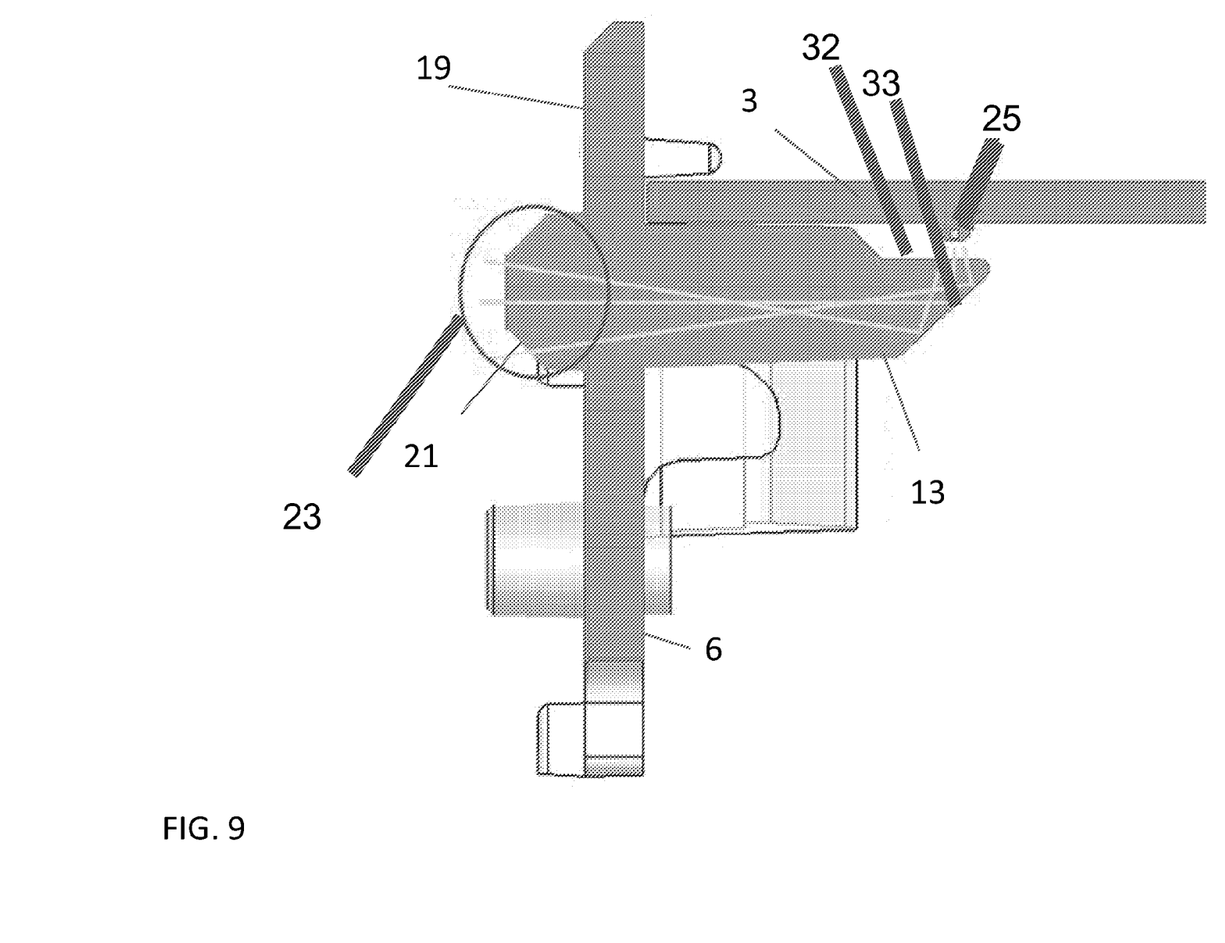
FIG. 9 is sectional view of the light pipe bracket, light pipe, mirror and light assembly according to an additional embodiment of the invention.

FIG. 9 illustrates another cross sectional view of the use of a light pipe 13 in the device 1 and how the light pipe 13 can be positioned with respect to the light source 24. This view shows that the light pipe 13 has its light entrance opening or window 32 on a horizontal side of the light pipe 13 that is at an acute angle with respect to the distal end of the light pipe. The distal end of the light pipe 8 in this embodiment can have or be an interior mirror 33. It is preferred that the angle is 45 degrees and the light from the source projects vertically and reflects off of the mirror 33. The mirror 33 then causes the light 23 to propagate horizontally down the light pipe to and out of the optical component 21. (In other embodiments shown earlier, the window is the slanted end.) The window can have a flat horizontal periphery and face the light source or light source assembly 24. In this example, the window 32 is under the light source assembly 24 which can be on the bottom side of the first circuit board 3. Also, this embodiment shows that the top of the light pipe can also support one of the printed circuit boards and can work in concert with the ribs shown FIG. 2. It is also important to point out that the expression proximal end is intended to mean the region of the light pipe that is at or in the plane of the planar body 19 and that this region can still be referred to as a proximal end even when some portion of the light pipe extends beyond the planar body 19 as shown in FIG. 9. Further, when a portion of the light pipe extends beyond the planar body and there is an optical feature (e.g. diffuser, lens, filter, optical glass or plastic, etc) at the end, the extension with the optical feature can be considered the optical component 21 or the optical feature can be considered being at the distal end.

The light sources 25 can be positioned outside or inside of the light pipes. In some embodiments, the light sources can be centered along the longitudinal axes of the light pipes when the light entrance windows are at least a portion of the slanted distal ends of the light pipes as shown in FIGS. 6-8. In other embodiments, the light sources can be above or below the horizontal longitudinal axes of the light pipes and can be above or below the slanted distal ends when the windows 32 of the light pipes are horizontally planar structures or openings adjacent to the slanted distal ends of the light pipes and when the windows 32 form an acute angle with the slanted ends. As shown in FIG. 9, the window 32 can be a stepped-down region of the light pipe barrel or a lower ledge region at the end of the light pipe barrel.

In sum, the light pipe bracket 6 shown in the various views are most beneficially utilized in a set top box, video player, gaming device, or other electronic devices utilizing light sources 24. The light sources 24 are preferably light emitting diodes that are mechanically located some distance from a front panel 22 of the finished device. In sum, the mechanical embodiments described above provide the features of a one piece light pipe bracket 6 that can isolate the multiple light pipes and provides a secondary function of holding the printed circuit boards. The light pipe bracket not only guides the light from the LEDs toward the front of the device, but it also helps hold the front of at least one printed circuit board. The light pipes can be held with at least two support bars 20 or small posts of plastic, but preferably two support bars or small posts support each of the light pipes to isolate the light to the three pipes alone. This assists in eliminating the spread of light throughout the bracket that causes unwanted illumination in certain places. By using one clear piece as the light pipe bracket having the multiple functionalities can assist is reducing costs, because it can reduce the number parts and can simplify manufacturing.

The foregoing illustrates only some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents. For example, although many of the features of the invention are described within the context of two printed circuit boards in which the first board is a daughter board, the invention can be utilized in devices having a single circuit board or in systems where the first circuit board is the main circuit. Additionally, the invention can be utilized in devices having one or any number of light pipes. Further, light pipes having distal ends which are not slanted and/or light pipes having cross sections which are circular or not circular are considered within the scope of the invention.

The invention claimed is:

1. An electronic device comprising:
   a base frame;
   a first printed circuit board over the base frame, the first printed circuited having a front edge;
   two opposing frame side walls extending perpendicularly from the base frame;
   a rear frame wall extending perpendicularly from the base frame;
   a light source positioned between the two opposing frame side walls;
   a light pipe bracket comprising:
      a planar main body being perpendicular to the base frame and opposing the rear frame wall said planar main body having at least one aperture;
      a light pipe having a proximal end and a distal end, wherein the proximal end is positioned in the at least one aperture, the light pipe extending from the planar main body toward the distal end, the light source positioned at the distal end;
   a plurality of support bars extending from an edge of the at least one aperture to a periphery of the proximal end in the same plane as the planar main body, thereby supporting the light pipe; and
   holding means on the planar main body, the holding means engaging the front edge of the first printed circuit board, thereby supporting the first printed circuit board.

2. The electronic device of claim 1, wherein each of the frame side walls comprises:
   a clip receiving aperture; and
   the light pipe bracket further comprises retention clips extending from the planar main body, the retention clips engaging the clip receiving apertures of the frame side walls, thereby supporting the light pipe bracket.

3. The electronic device of claim 2, wherein the light pipe bracket further comprises base engaging protrusions that extend downward from the planar main body, the base engaging protrusions being positioned into slots of the base frame.

4. The electronic device of claim 1, further comprising a plurality of the light pipes, each of the light pipes being positioned in an aperture of the planar main body and supported by a plurality of the support bars.

5. The electronic device of claim 4, further comprising a lens at at least one of the distal ends.

6. The electronic device of claim 1, further comprising a second printed circuit board between the first printed circuit board and the base frame.

7. The electronic device of claim 6, wherein the base frame comprises posts that support the second printed circuit board.

8. The electronic device of claim 6, further comprising:
   a plurality of the light pipes;
   a plurality of light sources; and
   a light source assembly associated with each of the plurality of light pipes, each of the light source assemblies supporting one of the plurality of light sources, the light source assemblies being disposed on the second printed circuit board.

9. The electronic device of claim 6, wherein one of the first or second printed circuit boards further comprises an upper circuit board structure and a lower circuit board structure connected through a central connecting portion in central regions of the upper and lower circuit board structures.

10. The electronic device of claim 9, wherein the front edge of the first printed circuit board that the holding means holds is a front edge of the upper board structure and additional holding means on the planar main body supports a front edge of the lower board structure.

11. The electronic device of claim 10, wherein at least a portion of the second printed circuit board is supported by posts on the base frame.

12. The electronic device of claim 6, wherein one of the first or second printed circuit boards is a main circuit board and another printed circuit board is a daughter printed circuit board.

13. The electronic device of claim 1, wherein a portion of the planar main body is tinted black.

14. The electronic device of claim 1, further comprising a front lens at the proximal end of the light pipe.

* * * * *